United States Patent
Anderson et al.

(10) Patent No.: US 7,105,934 B2
(45) Date of Patent: Sep. 12, 2006

(54) FINFET WITH LOW GATE CAPACITANCE AND LOW EXTRINSIC RESISTANCE

(75) Inventors: Brent A. Anderson, Jericho, VT (US); Andres Bryant, Underhill, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,170

(22) Filed: Aug. 30, 2004

(65) Prior Publication Data

US 2006/0043616 A1    Mar. 2, 2006

(51) Int. Cl.
*H01L 29/76* (2006.01)
*H01L 21/332* (2006.01)
*H01L 21/335* (2006.01)

(52) U.S. Cl. ............. 257/900; 257/213; 438/135; 438/142

(58) Field of Classification Search ............... None
See application file for complete search history.

(56) References Cited

U.S. PATENT DOCUMENTS

| | | | |
|---|---|---|---|
| 6,118,161 A | 9/2000 | Chapman et al. | 257/401 |
| 6,635,923 B1 | 10/2003 | Hanafi et al. | 257/327 |
| 6,660,596 B1 | 12/2003 | Adkisson et al. | 438/286 |
| 2003/0042531 A1* | 3/2003 | Lee et al. | 257/315 |
| 2003/0151077 A1 | 8/2003 | Mathew et al. | 257/250 |
| 2003/0178670 A1* | 9/2003 | Fried et al. | 257/315 |
| 2005/0098822 A1* | 5/2005 | Mathew et al. | 257/314 |

OTHER PUBLICATIONS

Lindert, et al., "Sub-60-nm Quasi-Planar FinFETs Fabricated Using a Simplified Process", IEEE Electron Device Letters, vol. 22, No. 10, Oct. 2001, pp. 487-489.

* cited by examiner

*Primary Examiner*—Andy Huynh
*Assistant Examiner*—Hoang-Quan Ho
(74) *Attorney, Agent, or Firm*—Gibb I.P. Law Firm, LLC; William D. Sabo, Esq.

(57) ABSTRACT

A FinFET device and a method of lowering a gate capacitance and extrinsic resistance in a field effect transistor, wherein the method comprises forming an isolation layer comprising a BOX layer over a substrate, configuring source/drain regions above the isolation layer, forming a fin structure over the isolation layer, configuring a first gate electrode adjacent to the fin structure, disposing a gate insulator between the first gate electrode and the fin structure, positioning a second gate electrode transverse to the first gate electrode, and depositing a third gate electrode on the fin structure, the first gate electrode, and the second gate electrode, wherein the isolation layer is formed beneath the insulator, the first gate electrode, and the fin structure. The method further comprises sandwiching the second gate electrode with a dielectric material. The fin structure is formed by depositing an oxide layer over a silicon layer.

29 Claims, 8 Drawing Sheets

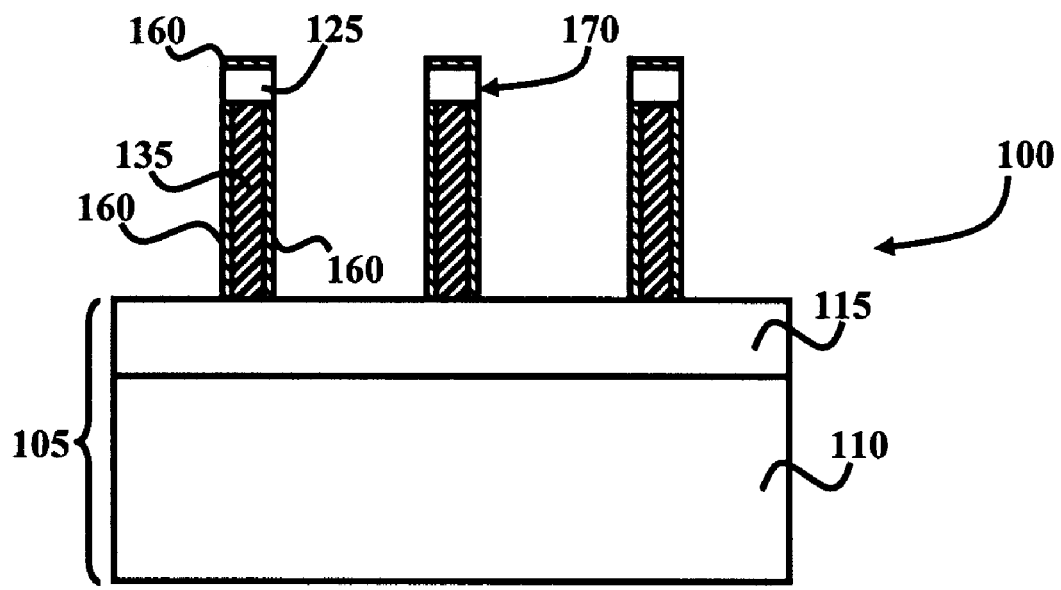
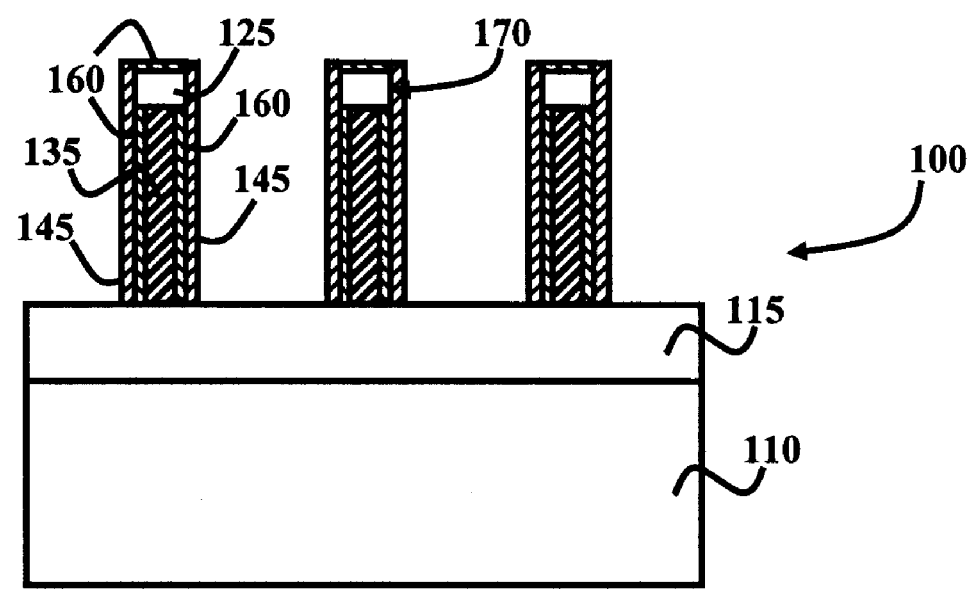

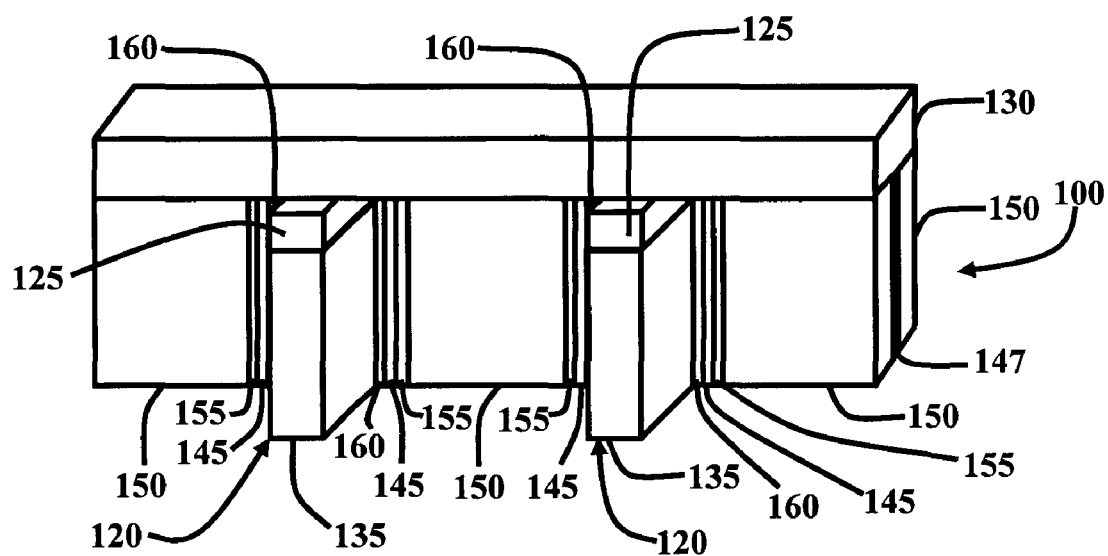
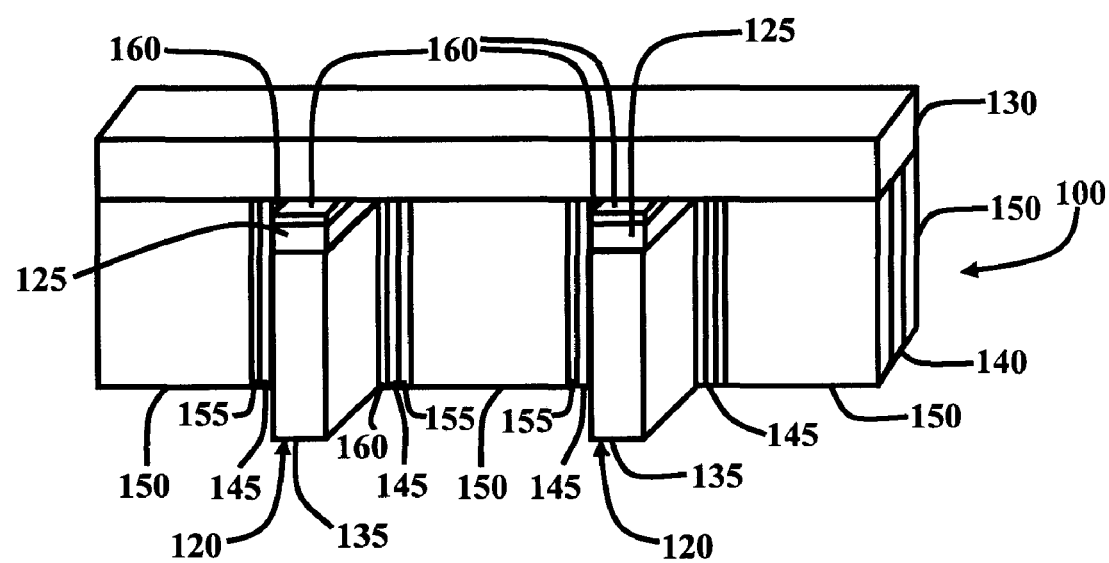

FINFET WITH LOW GATE CAPACITANCE AND LOW EXTRINSIC RESISTANCE

BACKGROUND OF THE INVENTION

1. Field of the Invention

The invention generally relates to microelectronic devices, and more particularly to the design and manufacturing of FinFET devices having improved performance characteristics.

2. Description of the Related Art

Thin-silicon-body field effect transistors (FETs) present a challenge to providing a low-resistance conduction path from the contacts to the source and drain electrodes to the intrinsic channel region in between the source and drain electrodes. Typically, one must expand (flair out) the thickness of the body by some distance beyond its egress from beneath the gate to provide adequate electrical conduction. However, if this expansion (flair out) is made more than several body thicknesses away from the gate, then the added resistance from the relatively long line of thin silicon in the extrinsic region adds substantial extrinsic resistance to the device, thereby degrading device performance.

On the other hand, if the expansion (flair out) is made relatively near the gate electrode, then the capacitance between the wide extrinsic region and the gate becomes large thereby increasing gate capacitance, which then causes degradation in device performance. For example, outer-fringe gate-drain capacitance ($C_{of}$) can be high in FinFET devices, which degrades device performance. Some conventional approaches have relied on means of tapering or stepping the width of the silicon as it exits the gate. The tapered designs typically rely on damascene gates, while the stepped-width designs have typically required multiple spacers and silicon growths or depositions. While these solutions have provided a possible solution to the low gate capacitance and low extrinsic resistance trade-off, the actual design and fabrication of such structures capable of achieving this trade-off has been extremely difficult and quite expensive.

FIGS. 1 and 2 illustrate an example of a conventional FinFET device 1. As shown in FIGS. 1 and 2, the conventional FinFET device 1 comprises a substrate 10 with a buried oxide (BOX) layer 15 over the substrate 10. On top of the BOX layer 15 there are source/drain regions 20 with a gate 30 disposed therebetween. Furthermore, the gate 30 contacts the BOX layer 15. A plurality of fins 35 are formed within and transverse to the gate 30. Additionally, an oxide capping layer 25 is formed over the source/drain regions 20 as well as over the fins 35.

The industry has recognized that a compromise must be made between the low extrinsic resistance and the low gate capacitance in such structures (for example the FinFET device 1) to alleviate the degraded performance characteristics conventionally found in these devices. However, until now no known adequate solution has been designed and fabricated. Therefore, there remains a need for a novel method and structure, which provides superior FinFET device performance while simultaneously achieving the low extrinsic resistance and low gate capacitance trade-off.

SUMMARY OF THE INVENTION

In view of the foregoing, an embodiment of the invention provides a field effect transistor (FET) comprising a substrate, an isolation layer comprising a buried oxide (BOX) layer positioned over the substrate, source/drain regions above the isolation layer, a fin structure over the isolation layer, conducting spacers positioned adjacent to the fin structure, with a gate insulator positioned between the spacers and the fin, a first insulator, preferably comprising nitride, adjacent to the spacers, a second insulator adjacent to the first insulator, and a gate layer positioned on the fin structure, the spacers, and the second insulator, wherein, in the preferred embodiment, the spacers and the gate layer comprise the same material, polysilicon, and wherein the isolation layer is adjacent to the first insulator, the spacers, and the fin structure. Also, the fin structure comprises an oxide layer over a silicon layer. Moreover, the FET further comprises an oxide layer adjacent to the fin structure. In an alternate embodiment, the FET further comprises a second oxide layer over the oxide layer, wherein the second oxide layer is planar to the gate layer.

Another aspect of the invention provides a FET device comprising a substrate, an isolation layer positioned over the substrate, source/drain regions above the isolation layer, a fin structure over the isolation layer, a first gate electrode adjacent to the fin structure, with a gate insulator positioned between the gate electrode and the fin, a second gate electrode positioned transverse to the first gate electrode, and a third gate electrode positioned on the fin structure, the first gate electrode, and the second gate electrode, wherein, in the preferred embodiment, the first gate electrode, and the third gate electrode comprise the same material, polysilicon, and the second gate electrode comprises polycrystalline silicon-germanium, and wherein the isolation layer is (a) positioned beneath the insulator, the first gate electrode, and the fin structure, and (b) is isolated from the second gate electrode. The device further comprises a dielectric material sandwiching the second gate electrode, wherein the dielectric material, in the preferred embodiment, comprises silicon dioxide. Also, in the preferred embodiment, the fin structure comprises an oxide layer over a silicon layer. Moreover, the device further comprises an oxide layer adjacent to the fin structure. In an alternate embodiment, the device further comprises a second oxide layer over the oxide layer, wherein the second oxide layer is planar to the third gate electrode.

Another embodiment of the invention provides a method of lowering a gate capacitance and extrinsic resistance in a field effect transistor, wherein the method comprises forming an isolation layer comprising a BOX layer over a substrate, configuring source/drain regions above the isolation layer, forming a fin structure over the isolation layer, configuring a first gate electrode adjacent to the fin structure, disposing a gate insulator between the first gate electrode and the fin structure, positioning a second gate electrode transverse to the first gate electrode, and depositing a third gate electrode on the fin structure, the first gate electrode, and the second gate electrode, wherein the isolation layer is formed beneath the insulator, the first gate electrode, and the fin structure. The method further comprises sandwiching the second gate electrode with a dielectric material. The fin structure is formed by depositing an oxide layer over a silicon layer. The method further comprises forming an oxide layer adjacent to the fin structure. In an alternate embodiment, the method further comprises forming a second oxide layer over the oxide layer, wherein the second oxide layer is planar to the third gate electrode. Additionally, the method comprises using the same material to form the first gate electrode and the third gate electrode, wherein the material comprises polysilicon, and using poly-crystalline silicon germanium for the second gate electrode material.

As a result of the embodiments of the invention, FinFETs with lower gate capacitance, lower drain and source capacitance and reduce extrinsic resistance can be achieved. Improved circuit performance, reduced switching time, and decreased power consumptions comprise some of the advantages which flow from the embodiments of the invention. Improved radio-frequency and analog circuit operation are also enabled by both the reduced drain-to-gate capacitance and the reduced extrinsic resistance advantages of the inventive embodiments.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIGS. 3 through 5 are side views of intermediate processing steps of a FinFET device according to an embodiment of the invention;

FIG. 12(a) is a perspective view of a FinFET device according to a first embodiment of the invention;

FIG. 12(b) is a perspective view of a FinFET device according to a second embodiment of the invention.

DETAILED DESCRIPTION OF PREFERRED EMBODIMENTS OF THE INVENTION

Figure 1:
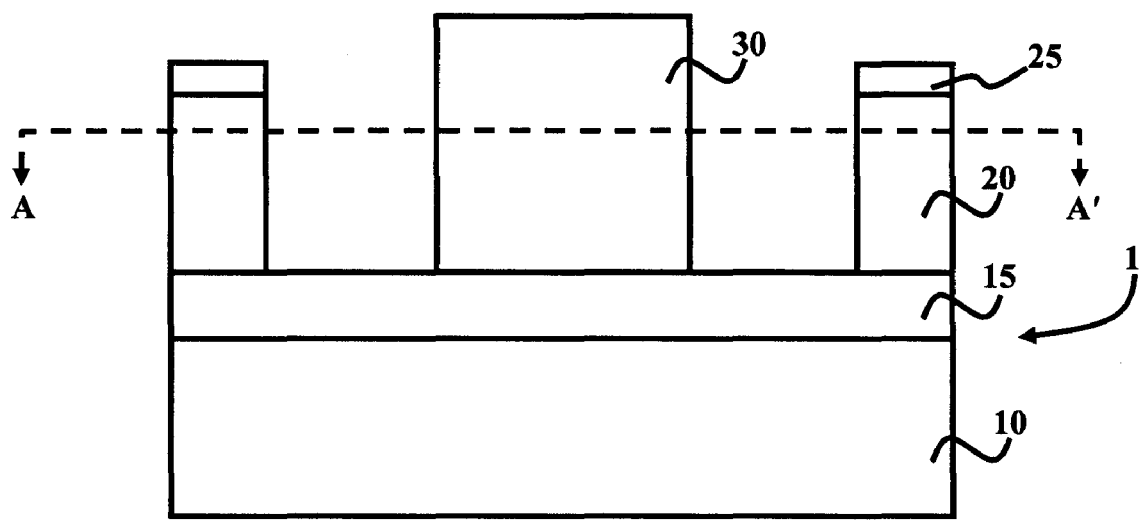
FIG. 1 is a front view of a conventional FinFET device.
Figure 2:
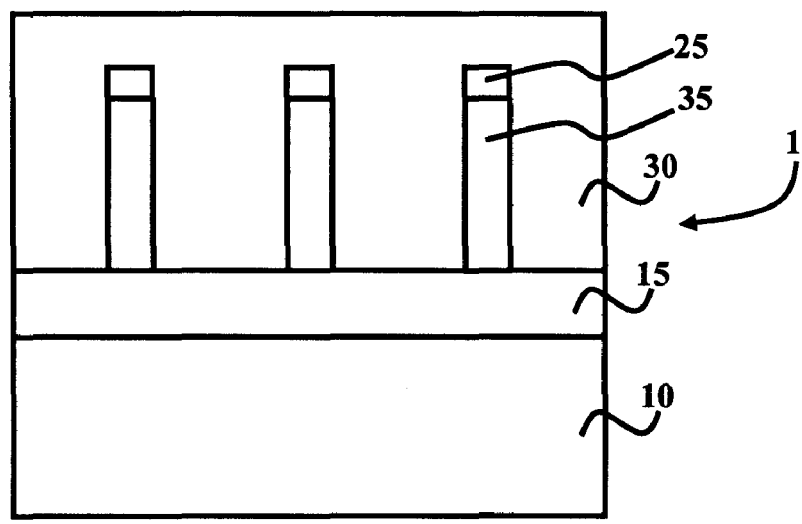
FIG. 2 is a side view cut along line A–A' of the conventional FinFET device of FIG. 1.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a novel method and structure, which provides superior FinFET device performance while simultaneously achieving the low extrinsic resistance and low gate capacitance trade-off. In order to address this need, an embodiment of the invention provides a FinFET device that effectively removes large portions of the gate electrode which would otherwise have been adjacent to the source/drain regions, thus lowering the gate-to-drain and gate-to-source capacitances. Furthermore, the source/drain regions can be formed a shorter distance from the gate to lower the extrinsic resistance of the FinFET device, without significant gate capacitance increase. Using the embodiments of the invention, a flair in the silicon extrinsic region designed at a small distance of approximately three to five body-thicknesses beyond the gate in a self-aligned manner may be implemented, thus achieving low extrinsic resistance, and means of tapering the gate electrode in a manner that is self-aligned to the gate edge in order to avoid the high drain-to-gate capacitance. Referring now to the drawings, and more particularly to FIGS. 3 through 13, there are shown preferred embodiments of the invention.

A FinFET device 100 according to an embodiment of the invention is illustrated in the generally sequential fabrication steps illustrated in FIGS. 3 through 8. As shown in FIG. 3, a silicon-on-insulator (SOI) wafer 105 is formed by any of a set of known fabrication sequences, such as Separation by Implantation of Oxygen (SIMOX) or Bond and Etch-back Silicon On Insulator (BESOI) methods, resulting in a buried oxide (BOX) layer 115 over a substrate 110. Formed over the BOX layer 115 is a silicon layer 135 capped by an oxide layer 125. Collectively, the silicon layer 135 and the oxide layer 125 form the fin structure 170. In this case the BOX layer 115 comprises the isolation layer for the FinFET device 100. Alternatively, a bulk silicon wafer capped by an oxide layer 125 can be etched to form the fin structure 170, and an isolation layer (BOX layer 115) formed above the etched silicon, for example, by deposition and etch-back of SiO$_2$. A gate dielectric layer 160, preferably silicon oxynitride, is then formed, or deposited along the sides of the silicon layer 135 (and on top of the oxide layer 125, when formed by deposition). Thereafter, a first electrode 145 is formed along the sides of gate dielectric layer 160 and the top of the oxide layer 125 of the fin structure 170, as shown in FIG. 4. The first electrode 145 preferably comprises polysilicon and is implanted with a dopant, such as arsenic or boron.

Figure 5:
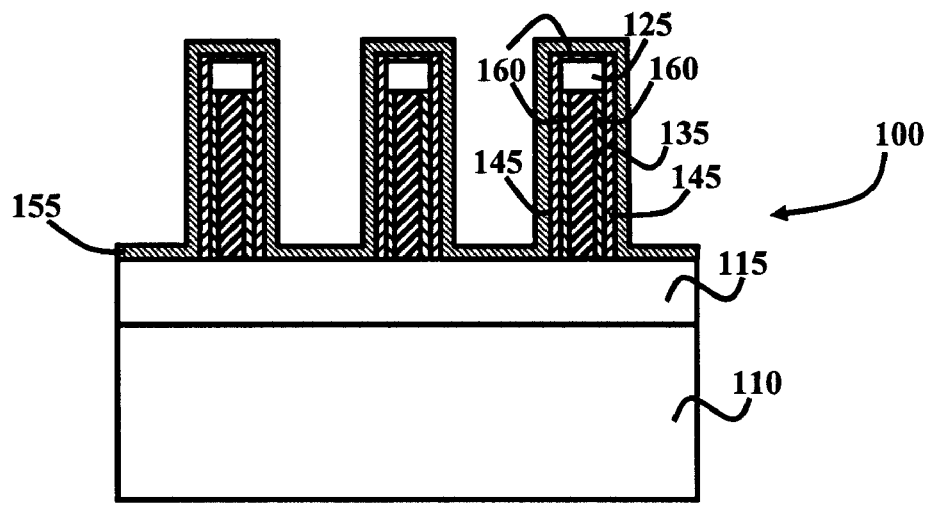
Figure 6:
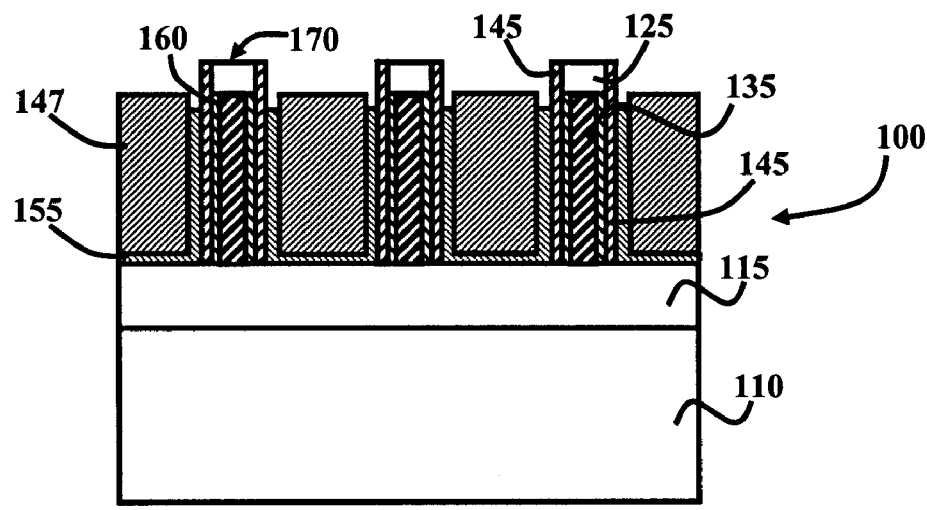
FIG. 6 is a side view of an intermediate processing step of a FinFET device according to a first embodiment of the invention.

Next, as shown in FIG. 5, an insulator liner 155, preferably comprising nitride, is grown over the entire structure 100 (e.g., by chemical vapor deposition). Thereafter, according to a first embodiment as shown in FIG. 6, a second insulator 147, which may comprise silicon dioxide, is formed adjacent to the nitride liner 155. Then, a partial etch is performed, whereby the second insulator 147, is etched back and planarized, exposing a portion of the nitride liner 155 surrounding the upper portion of the fin structure 170.

This exposed portion of the nitride liner 155 is then etched, thereby exposing top surfaces of the first gate electrode 145. Furthermore, the top layer of the oxide material 160 is removed from the top of the oxide layer 125 of the fin structure 170 according to the first embodiment. In the second embodiment illustrated in FIG. 7, a second gate electrode 140 is formed adjacent to the nitride liner 155 and transverse to the first electrode 145. Moreover, according to the second embodiment, the top oxide layer 160 over the oxide layer 125 is kept intact, and as such is not etched away, which is also shown in FIG. 7.

Figure 8:
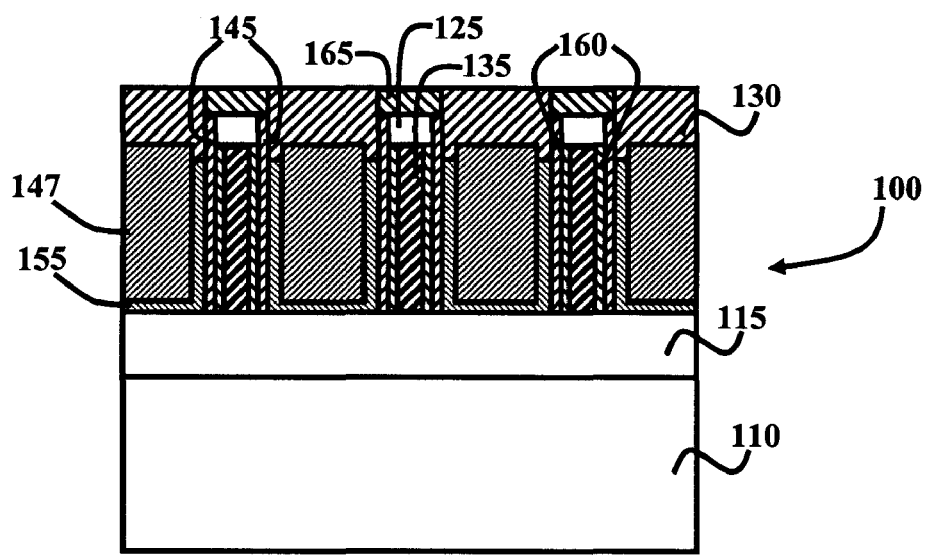
FIG. 8 is a side view of a FinFET device according to a first embodiment of the invention.

In accordance with the first embodiment, upon completion of the above steps, a second gate electrode 130 (i.e., the gate of the FinFET device 100) is deposited over the second insulator 147, exposed portions of the nitride liner 155, and exposed portions of the first gate electrode 145, as shown in FIG. 8. Here, a fin cap oxide 165 is deposited over the oxide layer 125. However, such a cap oxide 165 is not necessary according to the second embodiment, which retains the oxide layer 160 over the oxide layer 125. Thereafter, the device 100 undergoes further patterning and etching.

Figure 7:
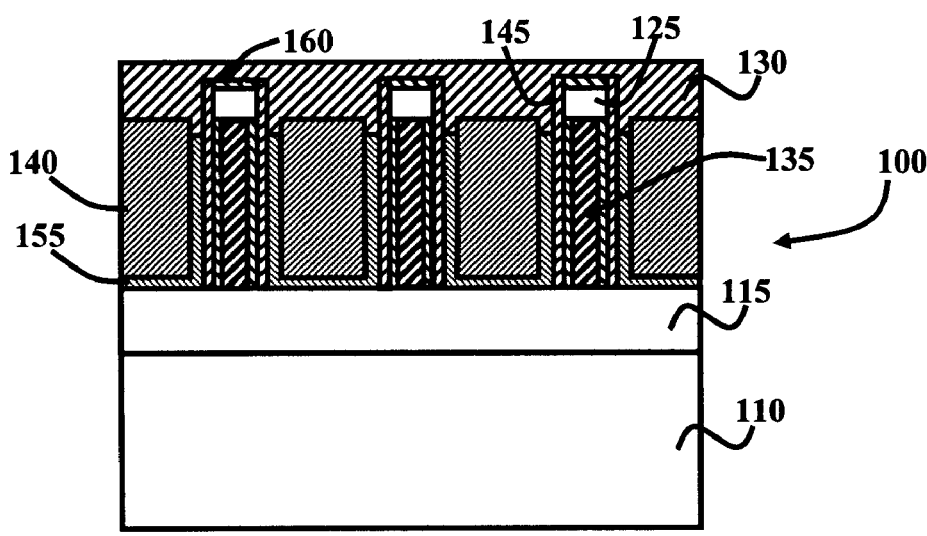
FIG. 7 is a side view of an intermediate processing step of a FinFET device according to a second embodiment of the invention.
Figure 9:
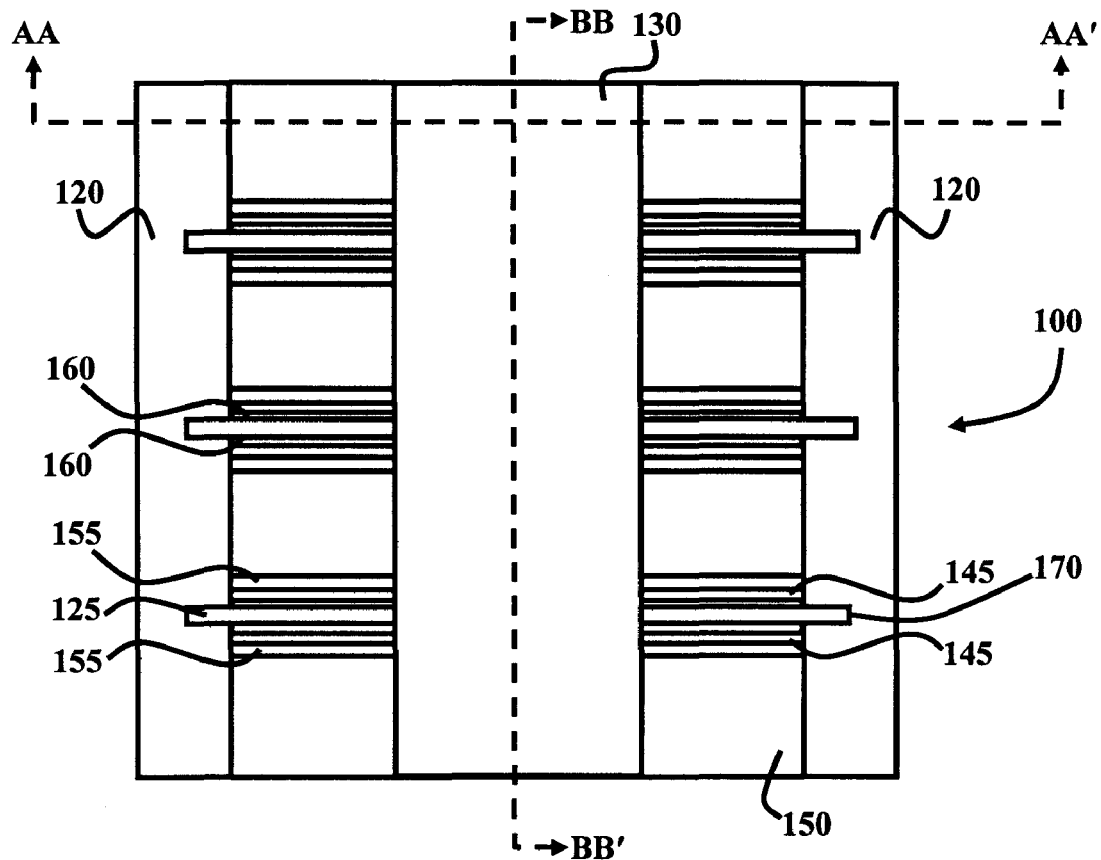
FIG. 9 is a top view of a FinFET device according to a first and second embodiment of the invention.
Figure 10A:
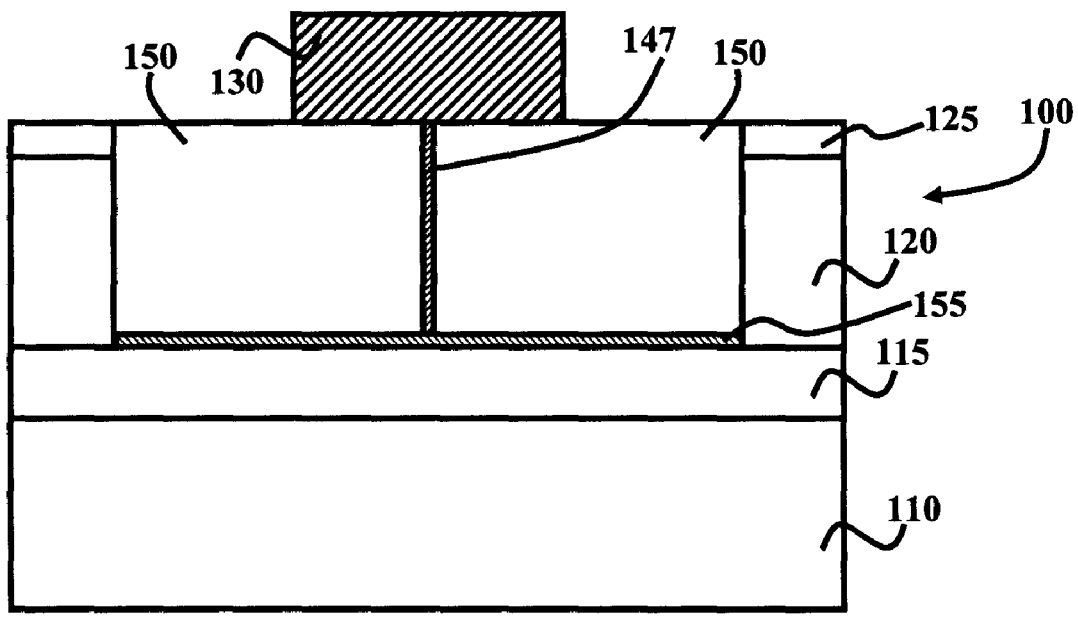
FIG. 10(a) is a front view cut along line AA–AA' of the FinFET device of FIG. 9 according to a first embodiment of the invention.
Figure 10B:
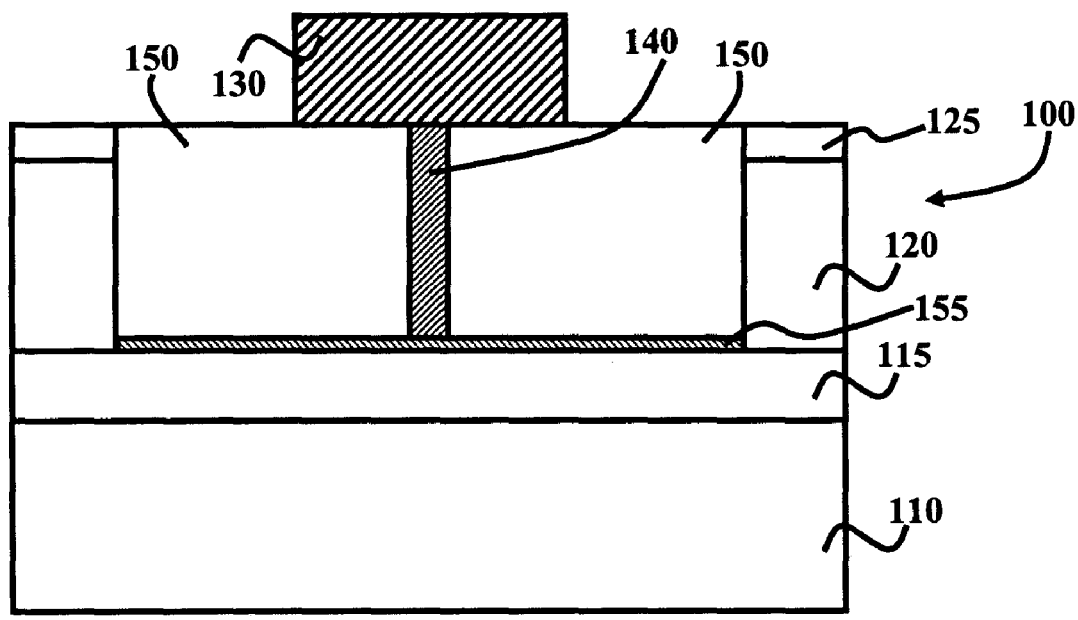
FIG. 10(b) is a front view cut along line AA–AA' of the FinFET device of FIG. 9 according to a second embodiment of the invention.

Generally, FIG. 7 (second embodiment) and FIG. 8 (first embodiment) illustrate the side view of the FinFET 100 cut along line BB–BB' of FIG. 9. Moreover, FIGS. 10(a) (first embodiment) and 10(b) (second embodiment) illustrate the front view of the Fin FET 100 cut along line AA–AA' of FIG. 9, where the several adjoining layers of the FinFET device 100 can be cross-sectionally viewed. Furthermore, source/drain conductive regions 120 are deposited/grown on the device 100 as is shown in FIGS. 9 and 10(a) and 10(b). FIG. 10(a) illustrates the second insulator 147 positioned underneath the gate 130 and in between the dielectric layer 150. FIG. 10(b) illustrates the second gate electrode 140 positioned underneath the third gate electrode 130 and in between the dielectric layer 150. Additionally, a portion of the oxide layer 125 remains over the source/drain regions 120 in both embodiments.

Figure 11A:
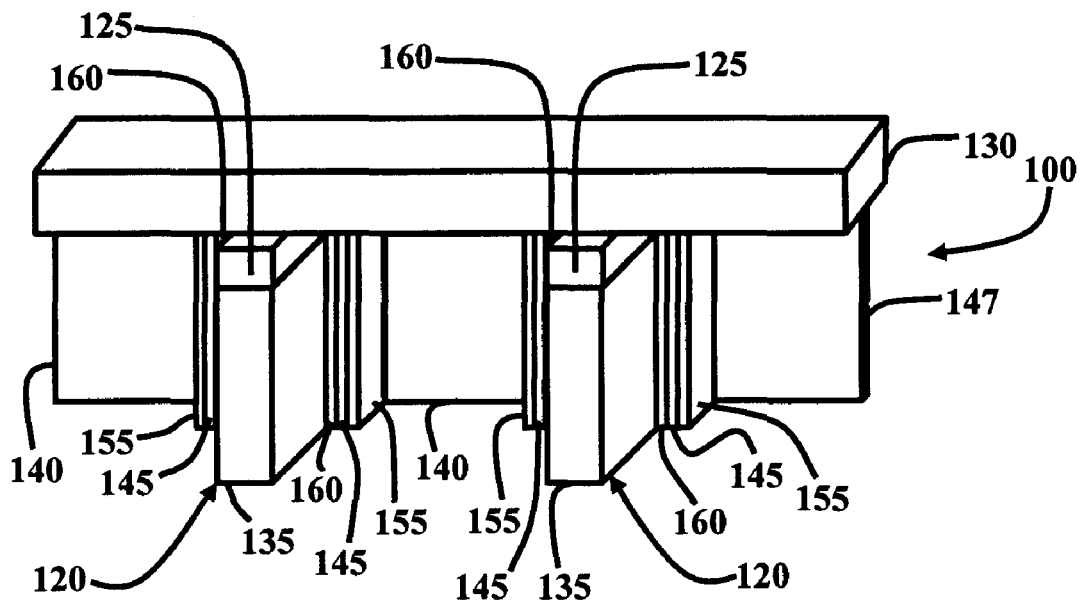
FIG. 11(a) is a perspective view of a partially completed FinFET device according to a first embodiment of the invention.
Figure 11B:
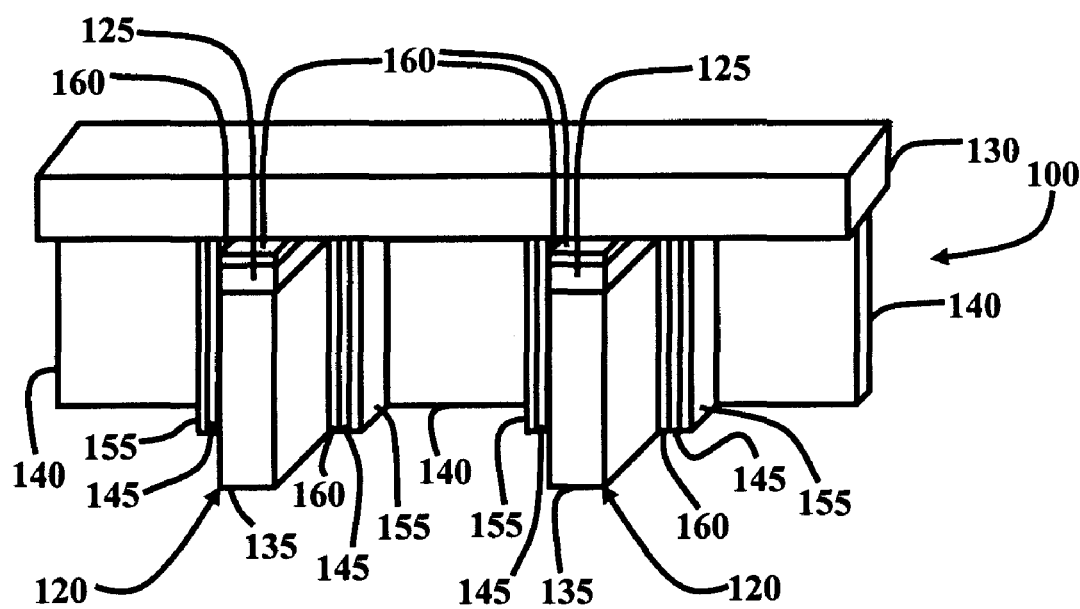
FIG. 11(b) is a perspective view of a partially completed FinFET device according to a second embodiment of the invention.

FIGS. 11(a) and 12(a) illustrate perspective views of the FinFET 100 according to the first embodiment, while FIGS. 11(b) and 12(b) illustrate perspective views of the FinFET 100 according to the second embodiment, where the oxide layer 160 is retained over the oxide layer 125. The FinFET devices 100 in FIGS. 11(a) and 11(b) are illustrated prior to the deposition of the dielectric layer 150, which is shown in FIGS. 12(a) and 12(b). As such, in FIGS. 12(a) and 12(b), fully planarized FinFET devices 100 are illustrated.

The FinFET device 100 effectively removes large portions of the gate electrode which would otherwise have been adjacent to the source/drain regions 120, thus lowering the gate-to-drain and gate-to-source capacitances. Furthermore, the source/drain regions 120 can be formed a shorter distance from the gate 130 to lower the extrinsic resistance of the FinFET device 100, without significant gate capacitance increase.

Figure 13:
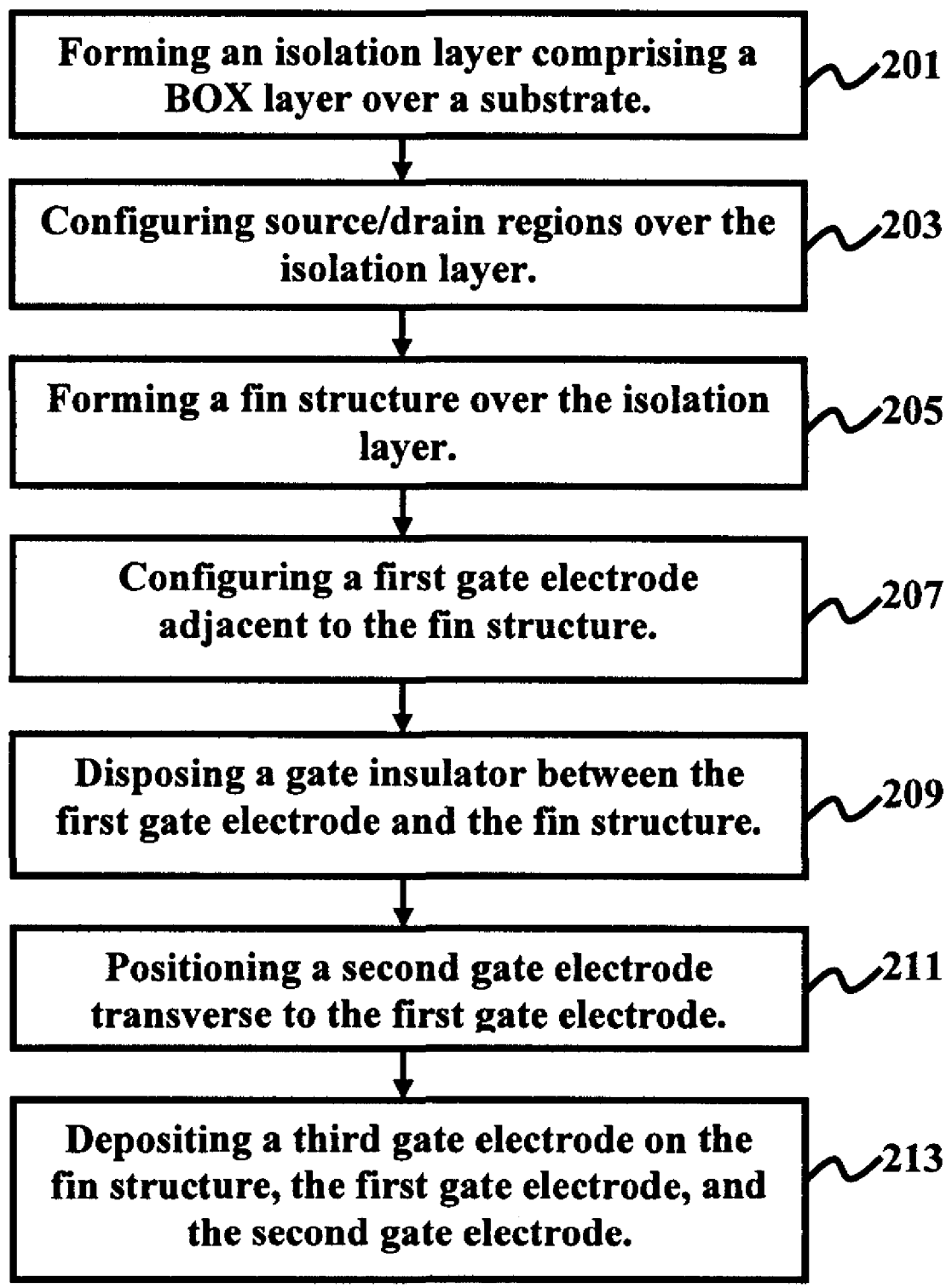
FIG. 13 is a flow diagram illustrating a preferred method of an embodiment of the invention.

Another embodiment of the invention is illustrated in the flowchart of FIG. 13, which includes descriptions which refer to components provided in FIGS. 3 through 12(b), whereby FIG. 13 depicts a method of lowering a gate capacitance and extrinsic resistance in a FinFET device 100, wherein the method comprises forming (201) an isolation layer comprising a BOX layer 115 over a substrate 110, configuring (203) source/drain regions 120 over the isolation layer 115, and forming (205) a fin structure 170 over the isolation layer 115. The method further includes configuring (207) a first gate electrode 145 adjacent to the fin structure 170, disposing (209) a gate insulator 160 between the first gate electrode 145 and the fin structure 170, positioning (211) a second gate electrode 140 transverse to the first gate electrode 145, and depositing (213) a third gate electrode 130 on the fin structure 170, the first gate electrode 145, and the second gate electrode 145, wherein the isolation layer 115 is positioned below the gate insulator 160, the first gate electrode 145, and the fin structure 170.

The method further comprises sandwiching the second gate electrode 140 with a dielectric material 150. The fin structure 170 is formed by depositing an oxide layer 125 over a silicon layer 135. The method further comprises forming an oxide layer 160 adjacent to the fin structure 170. In an alternate embodiment, the method further comprises forming a second oxide layer 165 over the oxide layer 160, wherein the second oxide layer 165 is planar to the third gate electrode 130. Additionally, the method comprises using the same material to form the first gate electrode 145 and the third gate electrode 130, wherein the material comprises polysilicon.

The embodiments of the invention may also apply to the case where the fin structure 170 comprises a silicon fin 135 surrounded on the two side surfaces and the top surface by gate oxide 160. In this case all three surfaces provide electrical channels for the FET (sometimes referred to as a Trigate FET) and is advantageous to keep the height of the silicon fin 170 comparable to the width of the silicon fin 170, with a favorable ratio of the height to the width between 2:3 and 5:4.

The first gate electrode 145 may be also be chosen from any of a number of metals or alloys of metals, including so-called mid-gap work-function metals such as tungsten or nickel silicide. The second gate electrode 140 may comprise any material which may be selectively removed in the presences of the silicon fin 135, the first 145 and third 130 gate electrodes, and the various dielectrics in place. The preferred material for the second electrode 140 comprises a SiGe alloy preferably with approximately 20% to 60% Ge. The third gate electrode 130 may comprise any conducting material compatible with ordinary silicon processing conditions, such as doped polysilicon, tungsten, or tungsten silicide.

As a result of the embodiments of the invention, FinFETs with lower gate capacitance, lower drain and source capacitance and reduce extrinsic resistance can be achieved. Improved circuit performance, reduced switching time, and decreased power consumptions comprise some of the advantages which flow from the embodiments of the invention such as FinFET structure 100. Improved radio-frequency and analog circuit operation are also enabled by both the reduced drain-to-gate capacitance and the reduced extrinsic resistance advantages of the inventive embodiments.

Generally, the embodiments of the invention provide a technique of lowering the gate-to-drain capacitance in a FinFET device 100 by reducing the height of the gate 130 in the non-essential areas located between and beyond the fins 170. This is accomplished by forming polysilicon gate sidewalls parallel to the fins 170 (with an oxide layer 160 formed therebetween) and adjacent to the fin oxide layer 125, and including a gate cap 165 connected to a gate strap 130, which serves as the gate of the device 100. The FinFET device 100 effectively removes large portions of the gate electrode which would otherwise have been adjacent to the source/drain regions 120, thus lowering the gate-to-drain and gate-to-source capacitances. Furthermore, the source/drain regions 120 can be formed a shorter distance from the gate 130 to lower the extrinsic resistance of the FinFET device 100, without significant gate capacitance increase.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the embodiments of the invention can be practiced with modification within the spirit and scope of the appended claims.

What is claimed is:

1. A field effect transistor (FET) comprising:
   a fin structure;
   conducting spacers contacting said fin structure, wherein an upper surface of said conducting spacers is substantially planar with an upper surface of said fin structure;
   an insulator contacting said spacers, wherein said insulator is structurally isolated from said fin structure; and
   a gate layer positioned on top of and contacting said fin structure, said spacers, and said insulator.

2. The FET of claim 1, further comprising:
   a substrate; and
   an isolation layer positioned over said substrate,
   wherein said isolation layer is positioned under said insulator, said spacers, and said fin structure.

3. The FET of claim 2, farther comprising source/drain regions above said isolation layer.

4. The FET of claim 1, wherein said fin structure comprises an oxide layer over a silicon layer.

5. The FET of claim 1, further comprising an oxide layer contacting said fin structure.

6. The FET of claim 4, further comprising a second oxide layer over said oxide layer, wherein said second oxide layer is planar to said gate layer.

7. The FET of claim 1, wherein said spacers and said gate layer comprise the same material.

8. The FET of claim 7, wherein said material comprises polysilicon.

9. The FET of claim 1, further comprising a gate insulator positioned between said fin structure and said spacers.

10. The FET of claim 1, further comprising a second insulator contacting said insulator.

11. A field effect transistor (FET) device comprising:
    a fin structure;
    a first gate electrode contacting said fin, structure;
    a gate insulator positioned between said first gate electrode and said fin structure;
    a second gate electrode positioned transverse to said first gate electrode; and
    a third gate electrode positioned on top of and contacting said fin structure, said first gate electrode, and said second gate electrode.

12. The device of claim 11, further comprising:
    a substrate; and
    an isolation layer positioned over said substrate,
    wherein said isolation layer is positioned beneath said gate insulator, said first gate electrode, and said fin structure.

13. The device of claim 12, wherein said isolation layer is isolated from said second gate electrode.

14. The device of claim 12, further comprising source/drain regions above said isolation layer.

15. The device of claim 11, further comprising a dielectric material sandwiching said second gate electrode.

16. The device of claim 11, wherein said fin structure comprises an oxide layer over a silicon layer.

17. The device of claim 11, further comprising an oxide layer contacting said fin structure.

18. The device of claim 16, further comprising a second oxide layer over said oxide layer, wherein said second oxide layer is planar to said third gate electrode.

19. The device of claim 11, wherein said first gate electrode and said third gate electrode comprise the same material.

20. The device of claim 19, wherein said material comprises polysilicon.

21. A method of lowering a gate capacitance and extrinsic resistance in a field effect transistor (FET), said method comprising:
    forming a fin structure;
    configuring a first gate electrode contacting said fin structure;
    disposing a gate insulator between said first gate electrode and said fin structure;
    positioning a second gate electrode transverse to said first gate electrode; and
    depositing a third gate electrode on top of and contacting said fin structure, said first gate electrode, and said second gate electrode.

22. The method of claim 21, further comprising forming an isolation layer over a substrate, wherein said isolation layer comprises a buried oxide (BOX) layer, and wherein said isolation layer is positioned beneath said gate insulator, said first gate electrode, and said fin structure.

23. The method of claim 22, further comprising configuring source/drain regions above said isolation layer.

24. The method of claim 21, further comprising sandwiching said second gate electrode with a dielectric material.

25. The method of claim 21, wherein said fin structure is formed by depositing an oxide layer over a silicon layer.

26. The method of claim 21, further comprising forming an oxide layer contacting said fin structure.

27. The method of claim 25, further comprising forming a second oxide layer over said oxide layer, wherein said second oxide layer is planar to said third gate electrode.

28. The method of claim 21, further comprising using the same material to form said first gate electrode and said third gate electrode.

29. The method of claim 28, wherein said material comprises polysilicon.

* * * * *